United States Patent [19]
Cline et al.

[11] Patent Number: 4,995,394
[45] Date of Patent: Feb. 26, 1991

[54] FAST NMR CARDIAC PROFILE IMAGING

[75] Inventors: Harvey E. Cline; Christopher J. Hardy, both of Schenectady,, N.Y.

[73] Assignee: General Electric Company, Schenectady, N.Y.

[21] Appl. No.: 392,315

[22] Filed: Aug. 11, 1989

[51] Int. Cl.$^5$ .............................................. A61B 5/05
[52] U.S. Cl. ................................. 128/653 A; 324/309
[58] Field of Search ............. 128/653 A, 653 AF, 653; 324/309

[56] References Cited

U.S. PATENT DOCUMENTS

| | | | |
|---|---|---|---|
| 4,516,582 | 5/1985 | Redington | 128/653 |
| 4,739,766 | 4/1988 | Riederer | 128/653 |
| 4,857,846 | 8/1989 | Carlson | 324/309 |

*Primary Examiner*—Francis Jaworski
*Assistant Examiner*—Kevin Pontius
*Attorney, Agent, or Firm*—Marvin Snyder; James C. Davis, Jr.

[57] ABSTRACT

A substantially continuous image, recording motion of a portion of a sample, is provided by first NMR exciting, through use of a rotating-gradient ($\rho$) pulse signal, a relatively narrow cylindrical region, typically with diameter less than 1 inch, of magnetization intersecting the sample to be imaged and then acquiring the NMR response signal thus excited, in the presence of a readout gradient oriented along the length of the cylindrical excitation beam and establishing position thereon. A Fourier transformation of the acquired data allows display of a real-time record of the profile of the sample along the axis of the cylindrical probe beam. The cylinder-beam axis can be oriented in an arbitrary direction by proper mixing of the excitation and readout gradient fields; use of three orthogonal gradients in a Cartesian coordinate system is presently preferred. Spatial offsetting of the cylindrical beam, from the center of the static magnetic field of the NMR imaging system, to any specific location within the system's imaging volume, can be obtained by frequency modulation of the $\rho$ pulse RF waveform.

14 Claims, 7 Drawing Sheets

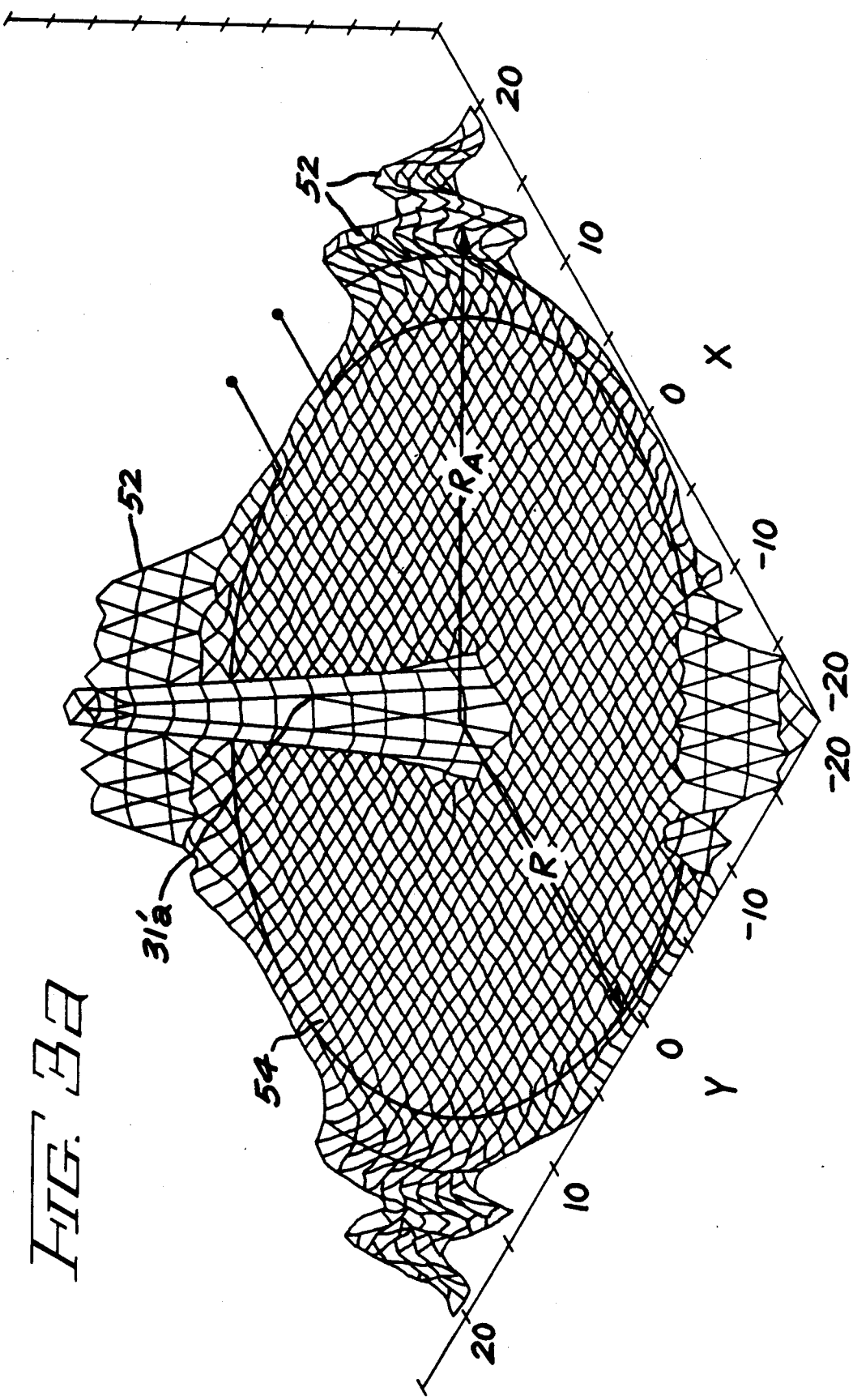

FAST NMR CARDIAC PROFILE IMAGING

BACKGROUND OF THE INVENTION

The present invention relates to nuclear magnetic resonance (NMR) imaging and, more particularly, to novel methods for providing rapidly-obtained NMR profile images of cardiac wall and/or valve motion.

At the present time, the most utilized method of cardiac imaging is ultrasound echocardiography which provides a reasonably fast and interactive means to access cardiac motion and provide a relatively thorough investigation of the heart, with relatively low risk to the patient. However, it is well known that ultrasound echocardiography is limited to viewing of the heart from positions (through "windows") between the patient's ribs, as the relatively dense rib bones substantially interfere with ultrasound propagation. Present medical clinical practice generally includes a M-mode examination as part of a complete cardiac study. In M-mode ultrasound echocardiography, a continuous plot of the time-varying position of tissue interfaces, observed along a one-dimensional axis, is provided by the motion of the cardiac portion (walls and/or valve) to be imaged, moving with respect to a stationary pencil-shaped beam of ultrasound energy. However, not all patients provide a suitable "window" for such an ultrasound examination, and some patients have a limited view of certain cardiac features, such as the mitral valve and the like. It is therefore highly desirable to provide for a M-mode imaging method utilizing a modality other than ultrasound, which provides all of the features thereof, to access wall and/or valve motion, without being limited to windows provided through anatomical portions of differing density in the patient to be imaged, and yet still allowing accurate beam positioning and suitable contrast to be obtained. A noninvasive NMR cardiac examination allows well known NMR imaging techniques to be utilized to provide excellent overall images of the heart and define image coordinates and angles with respect thereto; it is therefore desirable to provide a M-mode technique to interactively probe the heart and provide a relatively rapid cardiac profile for continuously recording the motion of various wall and-/or valve portions of the heart.

BRIEF SUMMARY OF THE INVENTION

In accordance with the invention, a substantially continuous image recording motion of a portion of a sample, is provided by: first NMR exciting a relatively narrow cylindrical region, typically with diameter less than 1 inch, of magnetization intersecting the sample to be imaged. Use of a rotating-gradient ($p$) pulse signal, which reorients a magnetic field gradient through two dimensions during the course of a RF excitation pulse, is presently preferred. The NMR response signal thus excited is then acquired in the presence of a readout gradient oriented along the length of the cylindrical excitation beam and establishing position thereon. A Fourier transformation of the acquired data is applied. The resulting data is a real-time record of the profile of the sample along the axis of the cylindrical probe beam. The cylinder-beam axis can be oriented in an arbitrary direction by proper mixing of the excitation and readout gradient fields; use of three orthogonal gradients in a Cartesian coordinate system is presently preferred. Spatial offsetting of the cylindrical beam, from the center of the static magnetic field of the NMR imaging system, to any specific location within the system's imaging volume, can be obtained by frequency modulation of the $p$ pulse RF waveform.

In one presently preferred embodiment, wherein a tradeoff between cylinder-beam diameter and selective-excitation pulse duration depends upon the maximum gradient slew rate of the NMR system, a typical pulse duration of about 7 milliseconds is utilized for achieving a 1 cm. beam diameter. Sequence repetition time $T_R$ of about 30 msec. yields at least 30 profiles per second, which profile data are plotted in a series of rows to create a recording of the changing profile with time.

Accordingly, it is an object of the present invention to provide novel methods for fast NMR profile imaging of an object, such as the cardiac region of a patient and the like.

This and other objects of the present invention will become apparent upon reading the following detailed description, when considered in conjunction with the associated drawings.

BRIEF DESCRIPTION OF THE DRAWINGS

FIG. 3a is a perspective graph of the sensitivity profile of a Gaussian selective-excitation probe beam resulting from the signals utilized in the excitation subsequence shown in FIG. 3;

FIG. 3b is an image of the beam sensitivity profile, utilized in the Gaussian selective-excitation sequence of FIG. 3, upon a large phantom of substantially uniform thickness and density;

FIG. 4a is a NMR system display showing a gated transaxial 1 cm.-thick cardiac image used to localize the selective-excitation beam axis; and FIGS. 4b–4d are a set of profile plots showing cardiac motion in three different locations of the myocardium of a volunteer subject.

DETAILED DESCRIPTION OF THE PREFERRED EMBODIMENT

Figure 1:
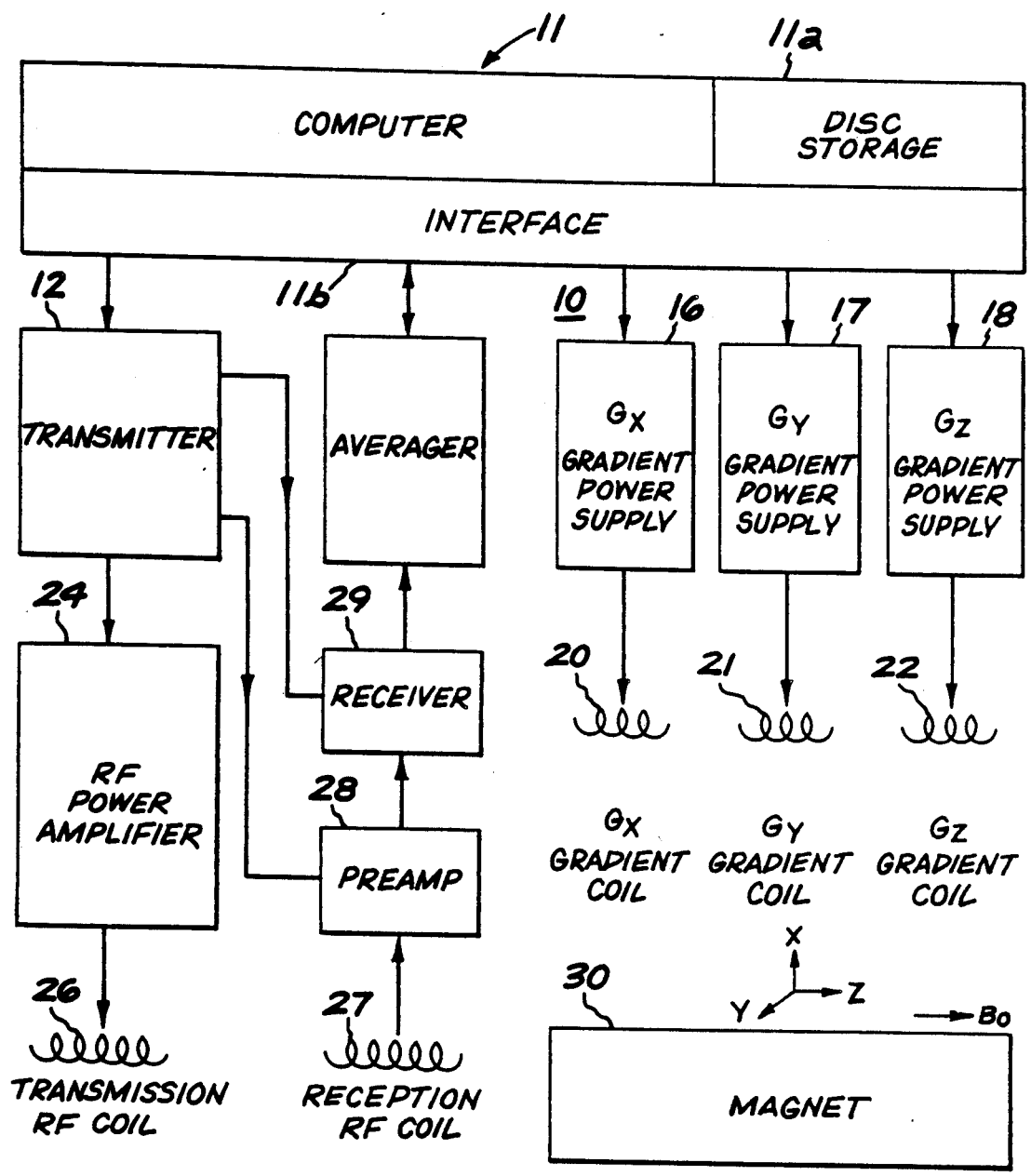
FIG. 1 is a block diagram of a NMR imaging system suitable for use with the method of the present invention.

FIG. 1 is a simplified block diagram of the major components of an NMR imaging system suitable for use with the NMR pulse sequences of the invention described herein. The system 10 is made up of a general purpose mini-computer 11 which is functionally coupled to a disk storage unit 11a and an interface unit 11b. An RF transmitter 12, signal averager 4, and gradient power supplies 16, 17 and 18 for respectively energizing X, Y and Z gradient coils 20, 21 and 2, are all coupled to computer 11 through interface unit 11b.

RF transmitter 12 is gated with pulse envelopes from computer 11 to generate RF pulses having the required modulation to excite nuclear resonance in the object under study. The RF pulses are amplified in RF power amplifier 24 to levels varying from 100 watts to several kilowatts, depending on the imaging method, and applied to transmitter coil 26. The higher power levels are necessary for large sample volumes, such as in whole body imaging, and where short duration pulses are required to excite large NMR frequency bandwidths.

The NMR signal is sensed by receiver coil 27, amplified in a low noise preamplifier 28 and applied for further amplification, detection, and filtering to receiver 29. The signal is then digitized for averaging by signal averager 14 and for processing by computer 11. Preamplifier 8 and receiver 29 are protected from the RF pulses during transmission by active gating or by passive filtering.

Computer 11 provides gating and envelope modulation for the NMR pulses, blanking for the preamplifier and RF power amplifier, and voltage waveforms for the gradient power supplies. The computer also performs data processing such as Fourier transforms, image reconstruction, data filtering, imaging display, and storage functions (all of which are beyond the scope of the present invention).

The transmitter and receiver RF coils, if desired, may comprise a single coil. Alternatively, two separate coils that are electrically orthogonal may be used. The latter configuration has the advantage of reduced RF pulse breakthrough into the receiver during pulse transmission. In both cases, the coils are orthogonal to the direction of a static magnetic field $B_o$ produced by a magnet means 30. The coils may be isolated from the remainder of the system by enclosure in an RF shielded cage.

Magnetic field gradient coils 20, 21 and 22 are necessary to provide gradients $G_x$, $G_y$, and $G_z$, respectively. In the imaging pulse sequences described herein, the gradients should be monotonic and linear over the sample volume. Multivalued gradient fields cause a degradation in the NMR signal data, known as aliasing, which leads to severe image artifacts. Nonlinear gradients cause geometric distortions of the image.

Figure 2:
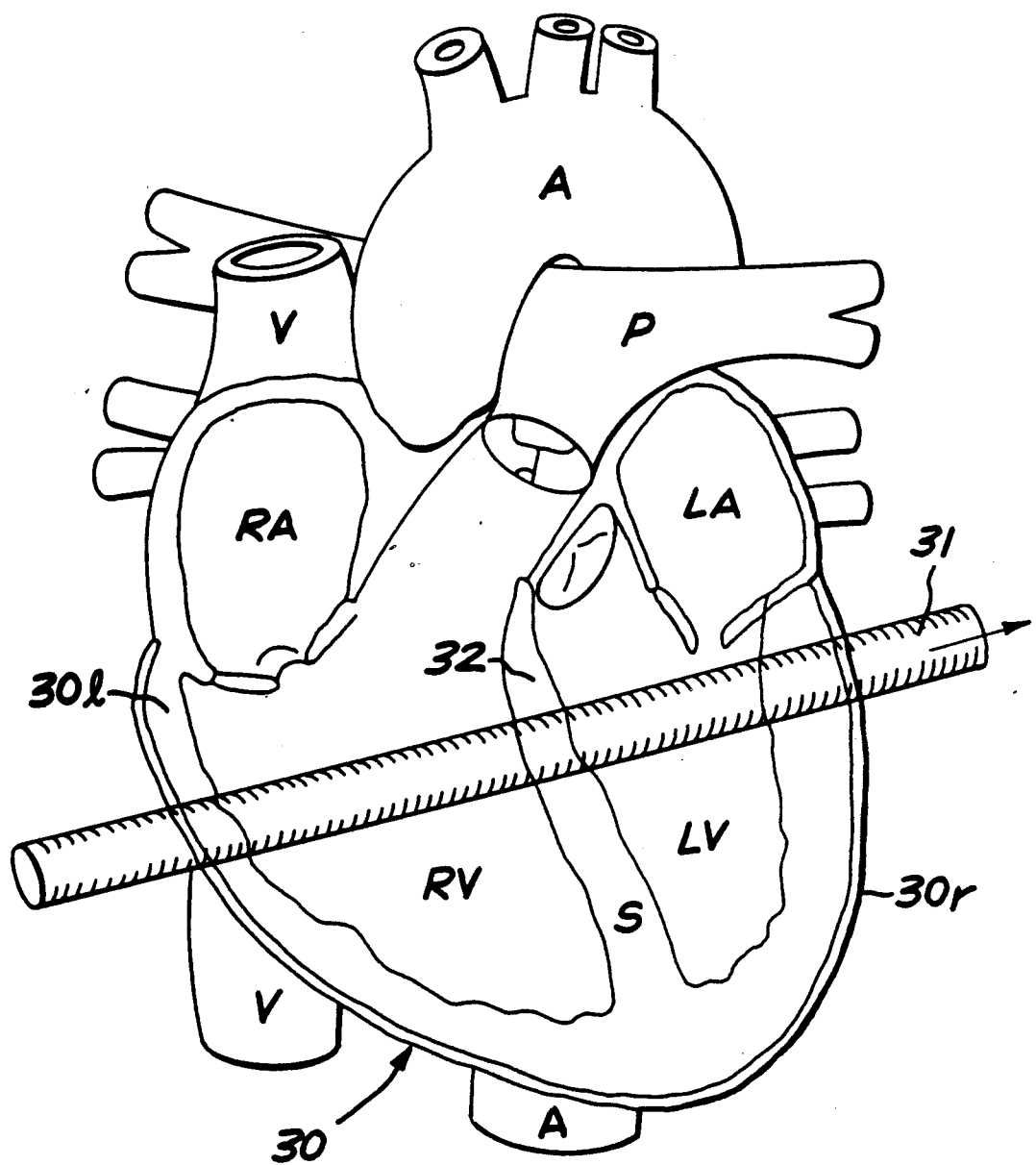
FIG. 2 is a schematic representation of the human myocardial region, illustrating probing of the ventricular volume thereof with an ideal selective-excitation probe beam extending substantially normal to the septum, and useful in appreciating the principles of the present invention.

Referring now to FIG. 2, a typical use for the imaging method of the present invention is to derive continuous real-time profiles of the motion of a desired portion (wall and/or valves) in the heart 30 of a human subject. A selectively-excited probe "beam" 31 (or cylindrical excitation pattern) is so directed as to pass through the desired portions of the sample; here, the beam passes into right side wall 30r of the sample heart, thence sequentially through the right ventricle, the septum and left ventricle thereof, exiting through the left heart wall 30l. Beam 31 is so angled and placed as to be substantially normal to the cardiac septum S, in this view. Unlike ultrasound echo-cardiography, since the NMR magnetic field gradient and RF signals (which establish the beam properties) are not substantially attenuated or otherwise modified by changes in density of portions of the sample, there are no particular "windows" to be located and utilized; beam 31 can be placed through any location 32 to be motion-imaged. The method of the present invention will return data indicating the motion of imaging location 32 on a real-time basis, with typically at least one dozen indications of the present location of imaging site 32 occurring for each beat of the cardiac sample being investigated.

Figure 3:
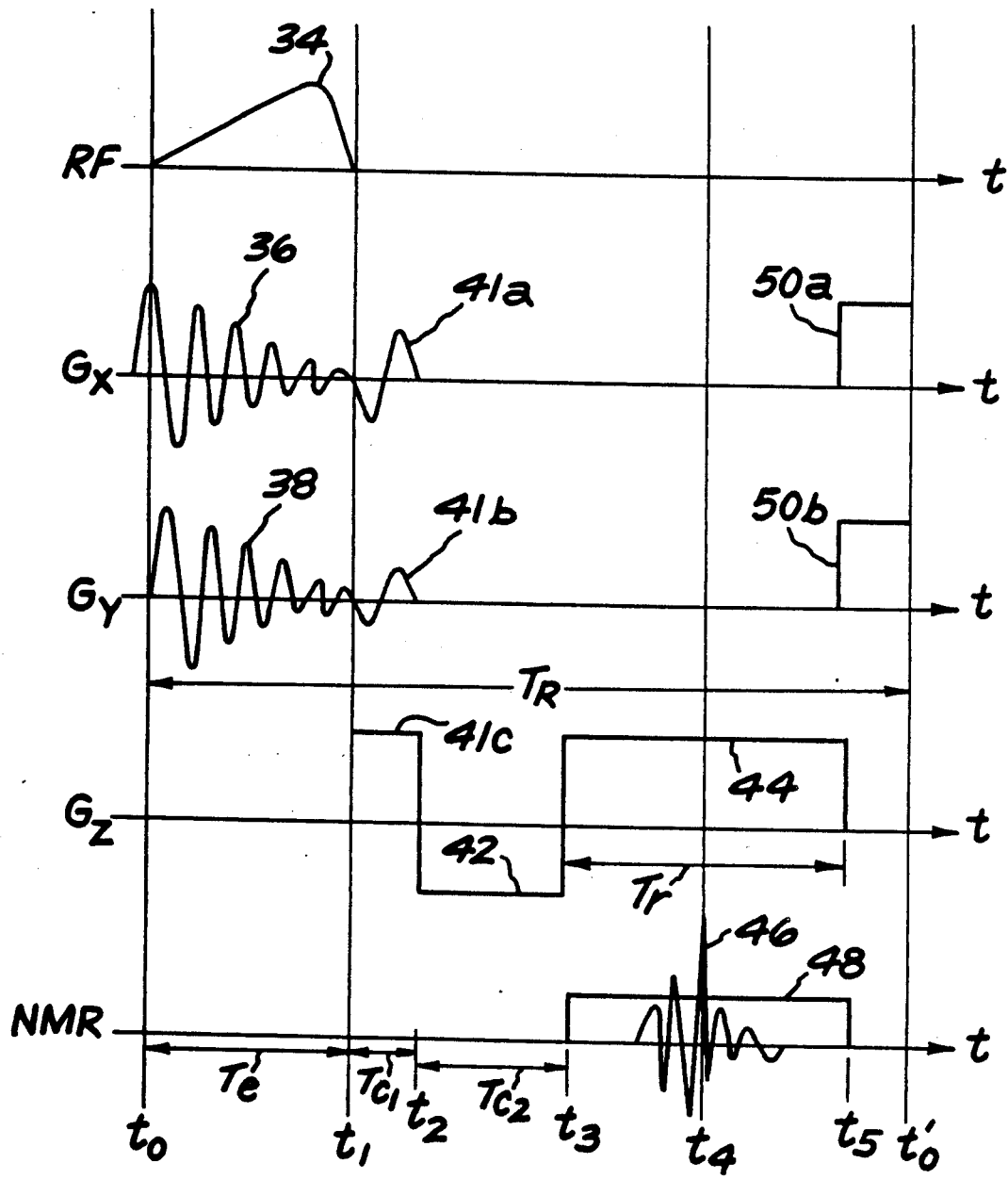
FIG. 3 is a set of graphs of RF and gradient magnetic field excitation signals and a resulting NMR response signal, in accordance with principles of the present invention.

FIG. 3 is a set of graphs of RF and gradient magnetic field excitation signals used to provide imaging data based upon a cylindrical probe beam 31, here extending substantially parallel to the Z-axis of the Cartesian coordinate system in the imaging volume of the NMR system magnet. This particular orientation is selected here for simplicity of description. Movement of the beam to other orientations (angular offset) with respect to the Z (longitudinal) axis of the system, and spatial offsetting from the center of the system imaging volume, can be obtained utilizing known methods, such as those described and claimed in U.S. Pat. No. 4,812,760, issued Mar. 14, 1989, assigned to the assignee of the present application and incorporated herein in its entirety by reference. This two-dimensional (2D) selective NMR inverting and refocussing set of pulses utilizes a simultaneous modulated-RF excitation pulse 34, commencing at a sequence start time $t_0$ and ending at a time $t_1$; the RF pulse has an amplitude-modulated envelope which may be symmetrical or, as shown, asymmetrical. Simultaneously with RF pulse 34, a two-dimensional magnetic field gradient is applied with the gradient magnetic fields, e.g. $G_x$ and $G_y$, in two dimensions generating a k-space spiral that reorients itself in a manner selected to generate the desired cylindrical probe beam 31. The pair of gradient pulses 36 and 38 thus have amplitudes decreasing linearly with time and have a plurality, e.g., eight, of periods within the excitation time interval $T_e$ from time $t_0$ to time $t_1$. This pulse is inherently refocussed, and obviates the need for an extra gradient refocussing lobe. It has been found that these excitation pulses can be utilized even where the probe beam is tipped at large angles (even as much as 90° or more) from the Z axis of the imaging volume; it is known that probe beams can be produced which excite volumes which are the Fourier transform of a weighted trajectory through k-space with the gradient waveforms 36 and 38 following a spiral which efficiently samples k-space. The accompanying RF signal waveform 34, which can be normalized to the k-space velocity, serves as a weighting function for the k-space trajectory, so that the method can be used to produce a cylindrical excitation beam with a Gaussian-profile cross-section, in the manner of Pauly et al. We achieve the desired cardiac-probe beam with uniform disc cross-section, by designing pulses in radial coordinates to produce radially-symmetrical excitation pulse profiles. The bandwidth of the pulse can thus be maximized by varying the rate of traversal of k-space subject to the constrain of the particular maximum gradient slew rate available in a particular NMR system.

After the probe beam excitation time interval $T_e$, flow compensation gradient pulses 40a, 40b and 40c may be utilized in a flow-compensation time interval $T_{c1}$, from time $t_1$ to time $t_2$, and an additional Z-gradient compensation lobe 42 may be provided in a second compensation time interval $T_{c2}$ from time $t_2$ to time $t_3$. This addition of flow-compensating bipolar gradients inverts the contrast of flow blood and suppresses flow artifacts. A readout subsequence is provided in a readout time interval $T_r$, from time $t_3$ to time $t_5$, where a readout gradient $G_{r,z}$ signal pulse 44 is provided in the beam direction (here, in the Z direction) normal to the plane (here, normal to the x-y plane) in which the probe beam undergoes reorientation. A gradient-echo NMR response signal 46 is received, and gated by a valid-data acquisition gate 48 about a central echo time $t_4$; the acquisition time interval $T_r$ may be about 8 msec. in a typical sequence with $T_R$ of about 30 msec. Thereafter, spoiler gradient signal pulses 50a and 50b may be provided in the gradients in which the reorienting magnetic field is provided for generation of the probe beam, to dephase the total magnetization and eliminate coherence prior to commencement of the next profile imaging sequence at start time $t_0'$ (at a repetition time $T_R$ between 30 and 50 msec., i.e. about 20 to about 33⅓ images per second).

One method for designing 2D excitation pulses commences with specification of gradient waveforms describing a spiral k-space trajectory $$k_x(t) = \kappa(1 - t/T_e)\cos(\omega t) \quad [1]$$

$$k_y(t) = \kappa(1 - t/T_e)\sin(\omega t) \quad [2]$$

where $\omega = 2\pi n/T_e$, $0 \leq t \leq T_e$, and n is the number of turns (e.g. eight) in the spiral. The gradient waveforms $g_x(t) = (1/\gamma)(dk_x/dt)$ and $g_y(t) = (1/\gamma)(dk_y/dt)$ are derived from the k-space trajectory. The RF waveform 34 needed to excite a 2D profile P(x,y) is then chosen to provide the correct weighting of the k-space trajectory:

$$B_1(t) = |\gamma \vec{g}(t)| p(\vec{k}(t)), \quad [3]$$

where $p(k(t))$ is the Fourier transform of P(x,y). For the spiral trajectory given by equations (1) and (2), we have $$|\gamma \vec{g}(t)| = \frac{\kappa}{T} \sqrt{\left(2\pi n \left(1 + \frac{t}{T_e}\right)\right)^2 + 1}. \quad [4]$$

For cylindrically symmetric profiles P(x,y) we convert to cylindrical coordinates $(r,\theta)$ and $(k,\theta_k)$ and express $p(\vec{k}(t))$ as $$p(k(t)) = 2\pi \int_0^\infty P(r) r J_0(k(t)r) dr, \quad [5]$$

where $J_0$ is the zero-order Bessel function. Then, $p(k(t))$ becomes the Hankel transform of P(r).

As seen in FIG. 3a, the probe beam 31'a has an aliasing excitation ring 52 at an aliasing radius $R_A$, due to an out-of-phase component proportional to the number of cycles in the spiral and also proportional to the spot size (i.e. $1/\kappa$). This aliasing ring 52 can be seen in FIG. 3b, which is an image taken in a 1.5T system of a phantom, of uniform thickness and density, illuminated by probe beam 31'a of FIG. 3a. To prevent aliasing ring 52 from disturbing observation, either the spot size (diameter) of beam 31'a or the number of cycles in excitation gradient waveforms 36 and 38 needs to be large enough to place ring 52 outside the moving tissue region of interest. Alternatively, the response signal can be received with a surface coil antenna 54, of radius R which is commensurate with the depth of the imaging location 32 into the sample (and below the surface coil 54 plane), and which radius R is less than the aliasing radius $R_A$; use of a reception surface coil also increases the signal-to-noise ratio.

Broadband pulses have been designed by varying the rate of traversal of the k-space trajectory to match the maximum slew rate over the course of the pulse. This yields a pulse with identical excitation characteristics on resonance but with twice the bandwidth of the constant-angular-rate pulse. In the case of a uniform spot of radius R, the RF excitation is determined from equation 5 to be $$B_1(t) = |\gamma \vec{g}(t)| \frac{2\pi R J_1(k(t)R)}{k(t)}, \quad [6]$$

where $J_1$ is a first order Bessel function. For practical 2D pulses, a smaller-diameter cylinder beam 31 can be created by using a Gaussian-excitation profile, relative to the beam created with a uniform circular profile employing the same k-space spiral trajectory. The Fourier transform of a Gaussian profile is also a Gaussian function and the excitation becomes $$B_1(t) = |\gamma \vec{g}(t)| e^{-R^2 \frac{k(t)^2}{2}} \quad [7]$$

The sensitivity profile in FIG. 3a is that of a Gaussian pulse with 8 gradient cycles, as results from the signals shown in FIG. 3. At small spot diameters, the Gaussian pulse is preferred over the uniform circular pulse for constant n, because it produces less ringing in the sensitivity profile.

FIG. 4a is a $^1H$ axial image of a male volunteer in a prone position, so that the heart is fixed adjacent to the sternum. The image illustrates four different probe beams a-d, each of which is planned to follow the associated white path; beams a-c are planned to traverse the myocardial region from lower-left to upper-right, while beam d is planned to traverse the region from upper-left to lower-right. An 8 cycle, one cm. diameter optimized Gaussian selective pulse is generated in $T_e = 6.5$ ms, as constrained by a slew rate of 2 gauss/cm-msec. The gradient-refocussed echo is constructed into a profile along the axis of the selective 2D pulse with a 1DFT. Each profile is displayed as a row in a 256×256 image. Typically, 30 profiles are acquired each second. The repetition time, $T_R$, is 35 msec. and the echo time $(t_4 - t_1)$ is 20 msec. in the examples illustrated. The axis of the selected cylinder is oriented by mixing various components of the gradients comprising the spiral. For example, to profile along the X axis, rotating gradients are applied in $G_y$ and $G_z$; a profile along the Z axis uses $G_x$ and $G_y$ gradient. Oblique directions require components along each axis to generate the oblique spiral in k-space. Displacement of the beam from gradient center by a distance $\vec{r}$ is accomplished by modulating the rf excitation by the complex exponential $\exp(i\vec{k}(t)\cdot\vec{r})$. The modulated waveforms are precomputed and stored in tables so that they may be recalled rapidly to adjust the beam placement. We practiced controlling the "beam" position interactively, by rotating the selective-excitation axis in the plane of the image and by using different offsetting distances, before actually profiling a human heart. The beam is positioned so that the aliasing ring (with a sufficiently large diameter) does not intersect moving blood. Cardiac profiling data was taken continuously without gating and periodic undulations in the region of the heart will be seen, in FIGS. 4b–4d, to be consistent with the volunteer's heart rate. An improved signal-to-noise ratio was obtained using a surface coil, with R=7 cm., placed near the apex of the heart, to improve the selectivity of the profile by limiting the sensitive region to that near the heart; without a surface coil, relatively large fields-of-view are required to prevent aliasing of signals from outside the field of view. In FIG. 4b, the beam (along line a of FIG. 4a) intersects the anterior wall of the left ventricle to show the periodic wall motion. Moving anterior along the left ventricle wall, to line of FIG. 4a, another wall motion pattern appears, as is shown in FIG. 4c. The beam is rotated to be normal to the septum to record the motion of the septum and cardiac chambers in FIG. 4d; note the arrythmia shown here, illustrating that local irregularities in the cardiac cycle can be measured by the continuous recording technique of MR cardiac profiling (unlike current clinical MR cardiac cine which uses retrospective gating to average over many cycles). By probing the heart at many locations, abnormal regions may be detected and different attributes of the cardiac function may be assessed. It will be seen that flow compensation removes some of the flow artifacts to reduce the apparent background noise and increase the signal from the blood in the heart.

While several presently preferred embodiments of our novel invention have been described in detail herein, many modifications and variations will now become apparent to those skilled in the art. For example, the flow compensation gradient lobes 41a and 41b (FIG. 3) and prephasing lobe (41c and 42) may be omitted, and the data acquired as a free-induction decay, with half-Fourier reconstruction, to further reduce flow artifacts. It is our intent, therefore, to be limited only by the scope of the appending claims and not by the specific details and instrumentalities presented by way of explanation herein.

What we claim is:

1. A method for providing a nuclear-magnetic-resonance (NMR) image of movement of a selected portion of a sample, relative to a predetermined center location at the origin of a set of axes defining an imaging volume, comprising the steps of:
   (a) immersing the sample in a static magnetic field formed in the imaging volume;
   (b) exciting spin magnetization of nuclei in a region of the sample defined by a relatively narrow elongated probe beam;
   (c) moving the probe beam to extend through the selected sample portion;
   (d) acquiring a NMR response signal from the excited region, in the presence of a readout magnetic field gradient oriented along the probe beam and with a magnitude establishing the location of the selected portion therealong; and
   (e) displaying said acquired NMR response signal as a profile of the sample along the beam versus time.

2. The method of claim 1, wherein steps (b)–(d) are periodically repeated, to cause the display to record the movement of the selected sample portion with respect to time.

3. The method of claim 2, wherein a heart is the sample and each repetition occurs in a repetition time interval $T_R$ of between about 30 and about 50 millisecs.

4. The method of claim 3, wherein between about 20 and about 35 repetitions occur each second.

5. The method of claim 2, wherein between about 20 and about 50 repetitions occur each second.

6. The method of claim 2, wherein step (c) includes the steps of: providing an excitation RF signal pulse substantially at the resonance frequency of the nuclear species to e imaged; and simultaneously providing a gradient magnetic field undergoing reorientation in a plane selected to be perpendicular to the direction of three-dimensional orientation of the probe beam through the sample.

7. The method of claim 6, wherein the reorienting gradient magnetic field establishes a tip angle of the probe beam with respect to the imaging volume axes; and step (c) further comprises the step of modulating the frequency of the RF excitation signal to spatially move the probe beam away from the predetermined center location.

8. The method of claim 7, further comprising the step of causing the probe beam to be of substantially cylindrical shape.

9. The method of claim 8, further comprising the step of causing the probe beam to have a substantially uniform cross-sectional profile.

10. The method of claim 8, further comprising the step of causing the probe beam to have a substantially Gaussian-cross-sectional profile.

11. The method of claim 8, wherein the probe beam has an aliasing ring at a radius $R_A$; and wherein step (d) further comprises the step of receiving the NMR response signal with a receiving antenna having an effective reception radius R less than $R_A$ and a central axis substantially aligned with the selected sample portion.

12. The method of claim 6, further comprising the step of flow compensating the reorienting magnetic field gradients to reduce response signal contribution from fluid flowing through the probe beam.

13. The method of claim 12, further comprising the step of flow compensating the readout magnetic field gradient.

14. The method of claim 13, further comprising the step of dephasing the total magnetization in the reorienting gradient magnetic field, prior to each periodic repetition.

* * * * *